(12) United States Patent
Erwin

(10) Patent No.: US 6,297,950 B1
(45) Date of Patent: Oct. 2, 2001

(54) FILTER ASSEMBLY FOR A MEMORY STORAGE DEVICE COOLER

(75) Inventor: Chris Erwin, Fremont, CA (US)

(73) Assignee: InClose Design, Inc., San Jose, CA (US)

( * ) Notice: Subject to any disclaimer, the term of this patent is extended or adjusted under 35 U.S.C. 154(b) by 0 days.

(21) Appl. No.: 09/335,448

(22) Filed: Jun. 17, 1999

(51) Int. Cl.⁷ .................................................. G06F 1/16
(52) U.S. Cl. .......................... 361/685; 361/684; 361/687; 361/688
(58) Field of Search .................................... 361/684, 685, 361/695, 725, 727, 686–688

(56) References Cited

U.S. PATENT DOCUMENTS

| | | |
|---|---|---|
| 5,168,171 * | 12/1992 | Tracewell .............................. 307/64 |
| 5,514,036 * | 5/1996 | Lin ....................................... 454/184 |
| 5,673,029 * | 9/1997 | Behl et al. ............................ 340/635 |
| 5,766,285 * | 6/1998 | Killman ............................... 55/385.6 |

\* cited by examiner

*Primary Examiner*—Leo P. Picard
*Assistant Examiner*—Yean-Hsi Chang
(74) *Attorney, Agent, or Firm*—Kevin H. Fortin; Burns, Doane, Swecker & Mathis, LLP

(57) ABSTRACT

An air filter assembly is useful with an external hard drive, a computer housing and memory storage device housings. The air filter assembly includes a frame, an air filter, and a retainer for slidably holding the air filter in the frame. Air filter deformation may result in captured dust and particulate matter dropping from the filter. The retainer of the present invention is specially configured for preventing filter deformation and dusty messes.

21 Claims, 4 Drawing Sheets

FILTER ASSEMBLY FOR A MEMORY STORAGE DEVICE COOLER

FIELD OF THE INVENTION

The present invention pertains to cooling devices for hard disk drives and more particularly to removable filter assemblies for use with cooling fans.

BACKGROUND OF THE INVENTION

U.S. Pat. No. 5,673,029 ('029 patent) discloses an Apparatus for Cooling a Memory Storage Device, the disclosure of which is incorporated herein by reference. The apparatus includes fans mounted on a bezel for drawing air through a memory storage device bay of a computer or a memory storage device housing. Drawing air through the bay is intended to cool a hard disk drive mounted in the bay, and to cool the housing. Using air to cool hard drives reduces the risk of data loss due to heat related hard drive failure.

Air may contain particulate matter such as dust and the like. Over time, dust may build up on electronic components within the computer housing. Using a fan to continually draw into the housing may accelerate the dust buildup. It is common for dust may build up on a motherboard, hard drive controller, video card, power supply, or other electronic components. Excessive dust buildup on an electronic component may enable the dust to conduct current, causing the component to short. What is desired is a way to improved electronic component reliability by reducing the amount of dust that enters the computer housing.

To remedy the problems associated with dust and particulate matter, filters are typically integrated with hard drive cooling kits to filter incoming air. Unfortunately, filters may become plugged after extensive use. A plugged filter should be removed, cleaned and replaced to maximize airflow through the filter. The '029 patent describes a bezel for holding an air filter, and an oval shaped cover that snaps on to the bezel to hold the air filter. The filter is flexible. When the filter is full of dust, removal of the filter may flex the filter and cause dust to fall from the filter. The dust may be drawn into the memory storage device housing, or fall on a desktop or floor, for example. Accordingly, what is desired is an improved system of filter removal and replacement that can ease filter replacement and reduce undesired mess associated with filter removal.

SUMMARY OF THE INVENTION

An air filter assembly is useful with any housing for electronic components. The air filter assembly is particularly adapted for use with computer and memory storage device housings having connective cooling. The air filter assembly includes a frame, an air filter, and a retainer for slidably holding the air filter in the frame. The retainer inhibits spillage of dust and particulate matter from the filter during filter removal.

The frame has an inlet, an outlet and two lateral sides. One lateral side includes a hinge connectable with the memory storage device bay, the other lateral side defines an opening to enable insertion and removal of the air filter. The frame has an inner periphery with grooves for receiving the retainer the air filter. The opening of the frame aligns with the grooves to enable the retainer and air filter to slide into the grooves. It can be appreciated that while grooves are integrated with the frame, that grooves can also be formed on the retainer to enable the retainer to mate with the frame.

The retainer has two sides and flexible joint to move the sides between an open configuration to a closed configuration. In the closed configuration, the sides of the retainer sandwich the air filter to hold the air filter. Each side has edges that rack in the grooves of the frame to insert the retainer in the frame when the retainer is in the closed configuration.

According to one aspect of the invention, the flexible joint of the retainer spring biases the retainer in the open configuration to press the retainer edges against the grooves of the frame when the retainer inserts into the frame.

The sides of the air filter have an inner face and an outer face that coincide with the inlet and outlet of the frame, respectively, when the filter inserts into the frame. The sides of the retainer surround the inner face and the outer face of the air filter. Preferably, the sides of the retainer form a grate to provide rigidity to the faces of the air filter without significantly inhibiting air flow through the filter.

According to an aspect of the invention where the invention is used to filter air flowing through a memory storage device bay, the frame and the air filter are rectangular shaped to fully cover the memory storage device bay. Preferably the retainer is fabricated from a spring material such as steel or other metal to firmly hold the filter while air turbulently flows through the air filter.

Removal of the air filter is periodically useful to facilitate cleaning of the air filter. The present invention enables removal and replacement of the air filter without making a dusty mess. The present invention also protects the air filter during and after air filter removal.

DETAILED DESCRIPTION OF THE INVENTION

Figure 1:
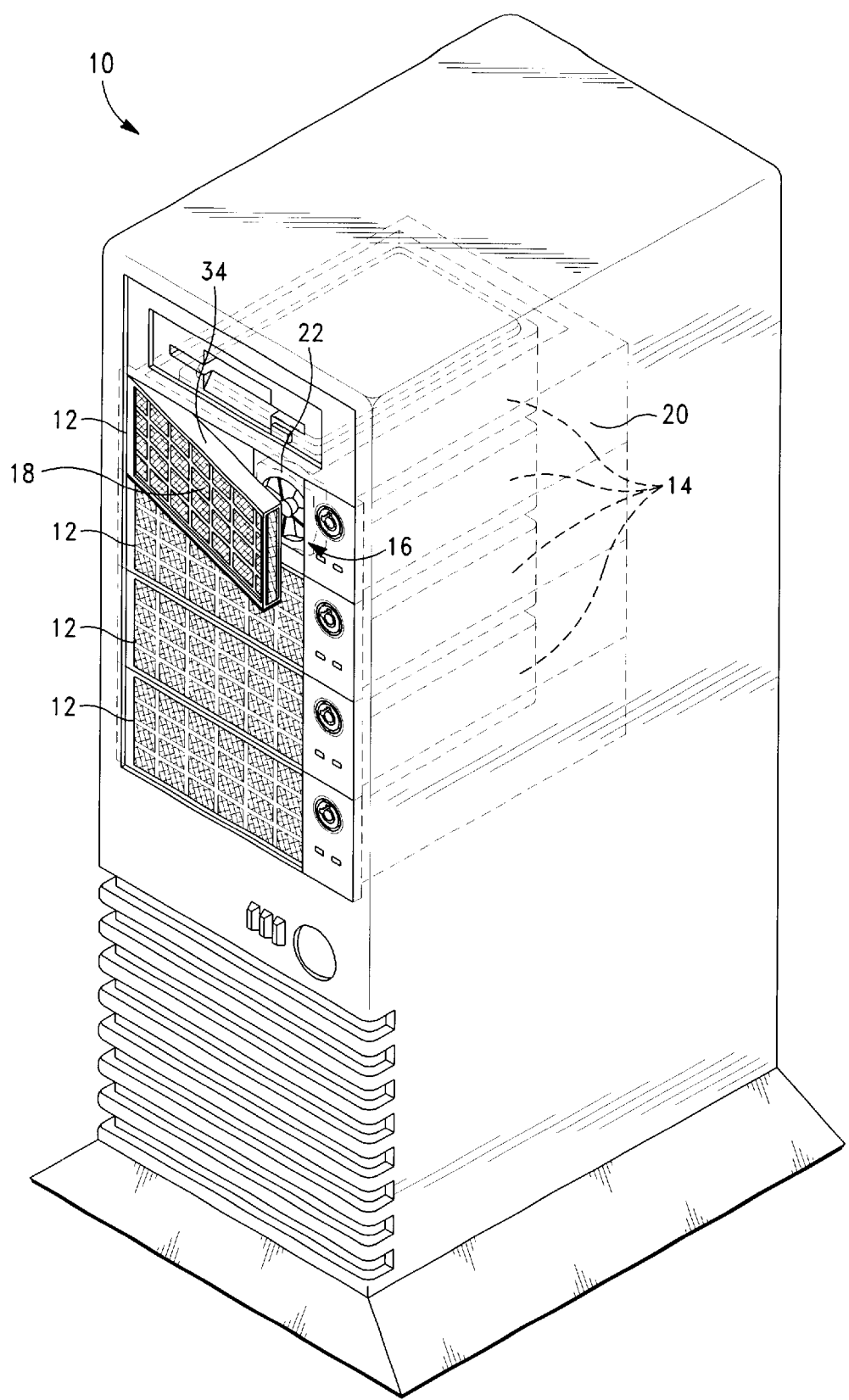
FIG. 1 shows the present invention used in a computer housing.

FIG. 1 shows a computer housing generally designated with the reference numeral 10. The computer housing 10 has multiple memory storage device bays 12, hard disk drives 14, and hard drive cooler assemblies 16 mounted in the memory storage device bays 12.

The hard drive cooler assembly 16 includes fans 22, a frame 34, and an air filter assembly 18. Each fan 22 mounts in a memory storage device bay 12. The frame 34 is hinged to the memory storage device bay 12 and includes a portion that functions as a door to swing from an open position to a closed position. In the closed position, the frame 34 lies flush with the computer housing 10 to cover the memory storage device bay 12, protecting the fans 22. In the open position, the frame 34 extends at an oblique angle with respect to the memory storage device bay 12 exposing the fans 22 and enabling removal of the air filter assembly 18 from the frame 34. The frame enables removal of the hard drive 14 from the housing 10 when the frame is in the open position.

It can be appreciated that although the present invention is used in a computer housing 10, the present invention can be used in conjunction with a RAID tower or other memory storage device housing, for example. Further, while the present invention is presented in combination with a hard drive cooler assembly, the present invention can also be used without fans.

Figure 2:
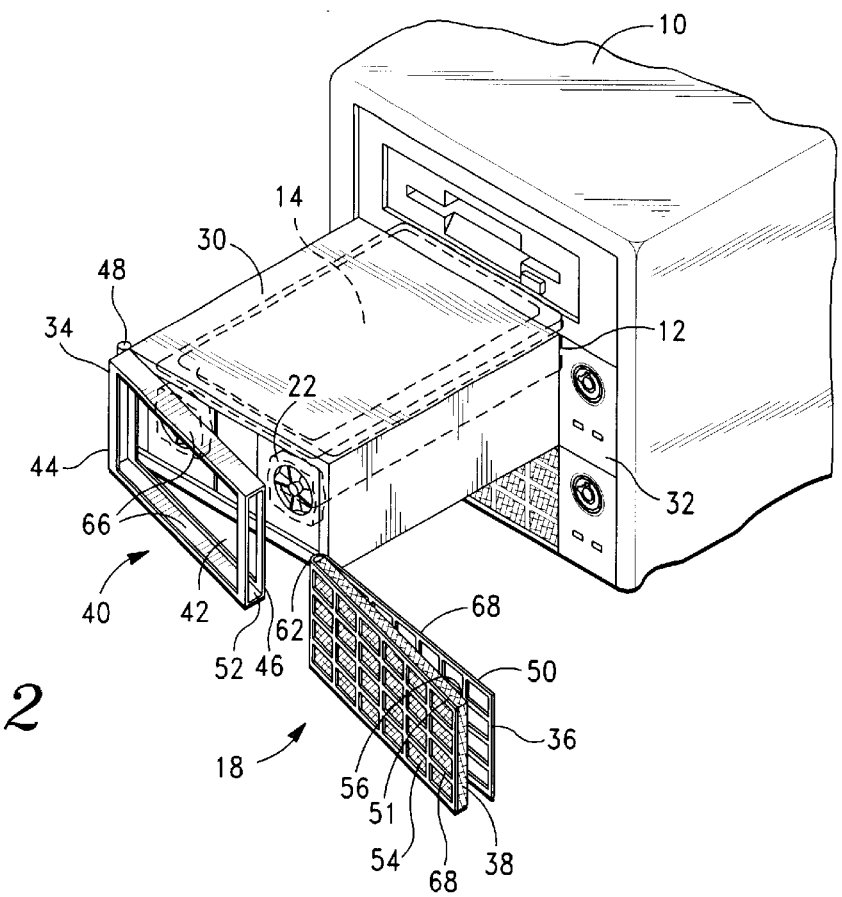
FIG. 2 shows the present invention being inserted into a removable memory storage device carrier.

FIG. 2 shows a portion of the computer 10 housing of FIG. 1. A carrier 30 and rack 32 removeably mount the hard drive 14 within the housing 10. The rack 32 is fixed in the memory storage device bay 12. The hard disk drive 14 is fixed in the carrier 30. The carrier 30 slides in an out of the rack 32 to insert and remove the hard disk drive 14 from the computer housing 10.

The air filter assembly 18 of the present invention includes the frame 34, an air filter 38, and a retainer 36. The retainer 36 holds the air filter 38 in the frame 34. The retainer 36 is specially configured to enable removal of the air filter 38 without deforming the air filter 38. Deformation of the air filter 38 when it is filled with dust can cause the dust to fall out of the filter 38 and possibly enter the housing 10. Accordingly the present invention keeps a memory storage device housing relatively dust free by minimizing filter deformation during operation and handling.

The frame 34 is configured to hold the retainer 36 and allow easy removal and installation of the retainer 36. The frame 34 has an air inlet 40, an air outlet 42 and two lateral sides 44 and 46. The inlet 40 and outlet 42 enable airflow through the frame 34 to cool the memory storage device bay. One lateral side 44 includes a hinge 48 for mounting the frame 34 on the memory storage device bay 12. The other lateral side 46 defines an opening 52 for receiving the retainer 36 and the air filter 38. The frame 34 firmly holds the retainer 36 and the air filter 38 during operation of the fans 22 to prevent filter 38 deformation resulting from fan-induced turbulent air flow.

The frame 34 swings about the hinge 48 between an open position and a closed position. In the open position, the frame 34 unlocks the carrier 30 from the rack 32 and the frame 34 extends at an oblique angle from the housing 10. When the carrier 30 unlocks from the rack 32, the hard drive 14 may be removed from the computer system 10. Additionally, when the frame 34 swings to the open position, the air filter 38 and retainer 36 are simultaneously removable from the frame 34. Simultaneous removal of the retainer 36 and the air filter 38 helps to prevent dust from escaping from the air filter 38.

The frame 34, the retainer 36 and the air filter 38 are rectangular shaped to fully cover a memory storage bay 12 having a rectangular opening. The air filter 38 is flexible and has a front face 54 and a rear face 56 that coincide, respectively with the inlet 40 and outlet 42 of the frame when the air filter assembly 18 inserts into the frame 34. The air filter 38 is made from a porous material to trap dust.

The retainer 36 has two sides 50 and 51 and a flexible joint 62 between the sides that folds to enable the retainer 36 to and surround at least a portion of each of the two faces 54 and 56 of the air filter 38. Preferably, the retainer 36 sandwiches the air filter 38 to hold the air filter 38 and to provide rigidity to the air filter 38. The flexible joint 62 enables the retainer 36 to fold between an open configuration where the air filter 38 may be replaced, to a closed configuration where the retainer 36 sandwiches the air filter 38. The flexible joint 62 spring biases the retainer 36 in the open configuration so that the retainer 36 firmly presses outward against the frame 34 to hold the air filter 38 in the frame 34.

The retainer 36 sandwiches the air filter 38 to insert the filter 38 into the frame 34 via the opening 52 in the lateral side 46 of the frame 34. When the retainer 36 inserts the air filter 38 into the frame 34, and when the retainer 36 holds the air filter 38 in the frame 34, the frame 34 presses the sides of the retainer 36 against the faces 54 and 56 of the air filter 38. Pressing the sides of the retainer 36 with the frame 34 minimizes filter 38 deformation.

Removal of the retainer 36 from the frame 34 is accomplished by pressing the sides of the retainer 36 together to release pressure between the retainer 36 and the frame 34. Pressing the sides of the retainer 36 together holds dust in the air filter 38 to inhibit dust spillage during air filter removal. The retainer 36 provides rigidity to the air filter 38 to further ease removal of the air filter 38 from the frame 34. The retainer 36 optionally provides rigidity and protection to the air filter 38 during air filter 38 cleaning.

According to an aspect of the invention, the sides of the retainer 36 form a grate to improves rigidity of the air filter 38 and thereby inhibits spillage of dust from the air filter 38 during air filter 38 removal. The grate also protects the air filter 38 from damage.

The frame 34 has an inner periphery with top and bottom grooves 66. The retainer has a top edge 68 and a bottom edge 68. The groves 66 of the frame 34 enable the edges 68 of the retainer 36 to smoothly mate with the grooves 66 and slide with respect to the frame 34. Smoothly mating the edges 68 of the retainer 36 and the grooves 66 of the frame 34 minimizes friction between the frame 34 and the retainer 36. Reducing friction enables the retainer 36 to be removed smoothly from the frame 34 to minimize dust spillage. Mating between the edges 68 of the retainer 36 and the grooves 66 of the frame 34 also provides rigidity to the air filter 38 so that the air filter 38 will not deform, tear or contact the fans 22 during removal.

Figure 3:
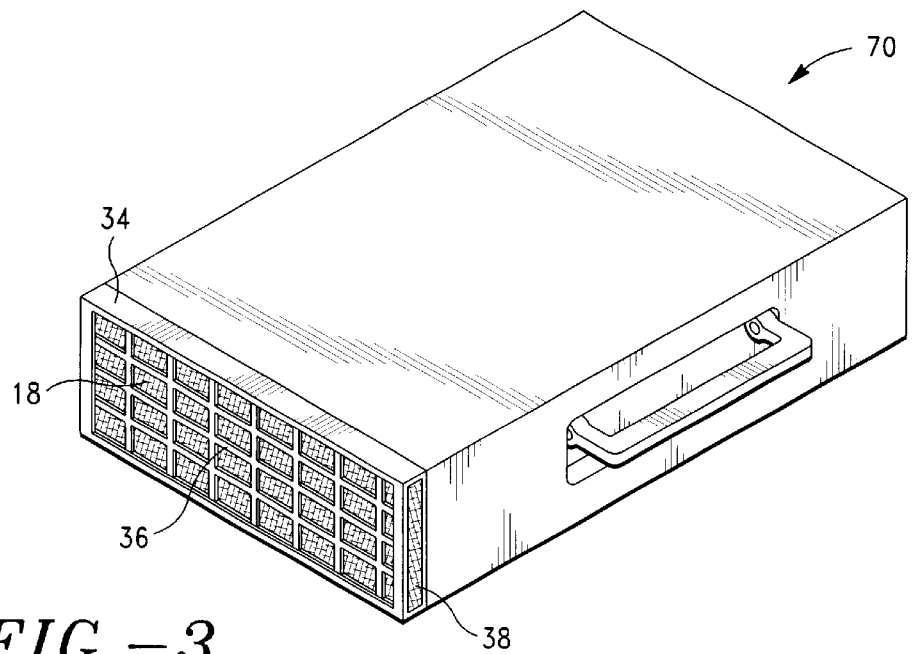
FIG. 3 shows the present invention on an external hard disk drive housing.

FIG. 3 shows an external hard drive housing 70. The frame 34 mounts on one side of the housing 70 to hold the retainer 36 and the air filter 38.

It can be appreciated that the configuration of the retainer can be varied in many ways without departing from the scope of the present invention. For example, the retainer can fully surround the filter. Additionally, the grate-shaped sides of the retainer may be re-configured for aesthetics and for function. The size of the grate openings can be changed to inhibit dust from entering the housing upon removal of the air filter assembly 18.

Figure 4:
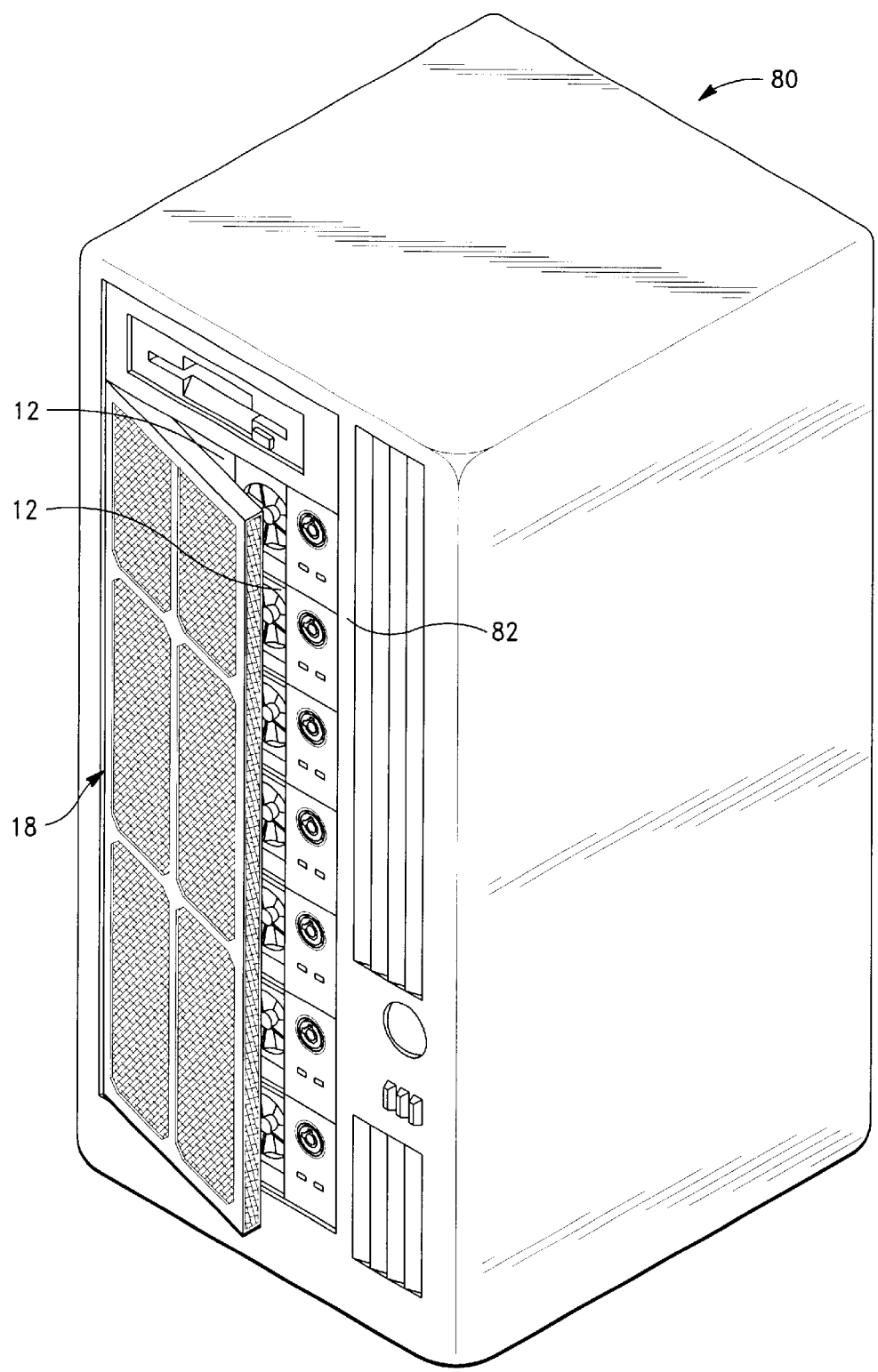
FIG. 4 shows a perspective view of a memory storage device tower employing the present invention.

FIG. 4 shows a memory storage device housing 80 having a face 82 and multiple memory storage device bays 12. The air filter assembly 18 covers multiple bays 12 and a significant portion of the face 82 of the memory storage device housing 80.

Figure 5:
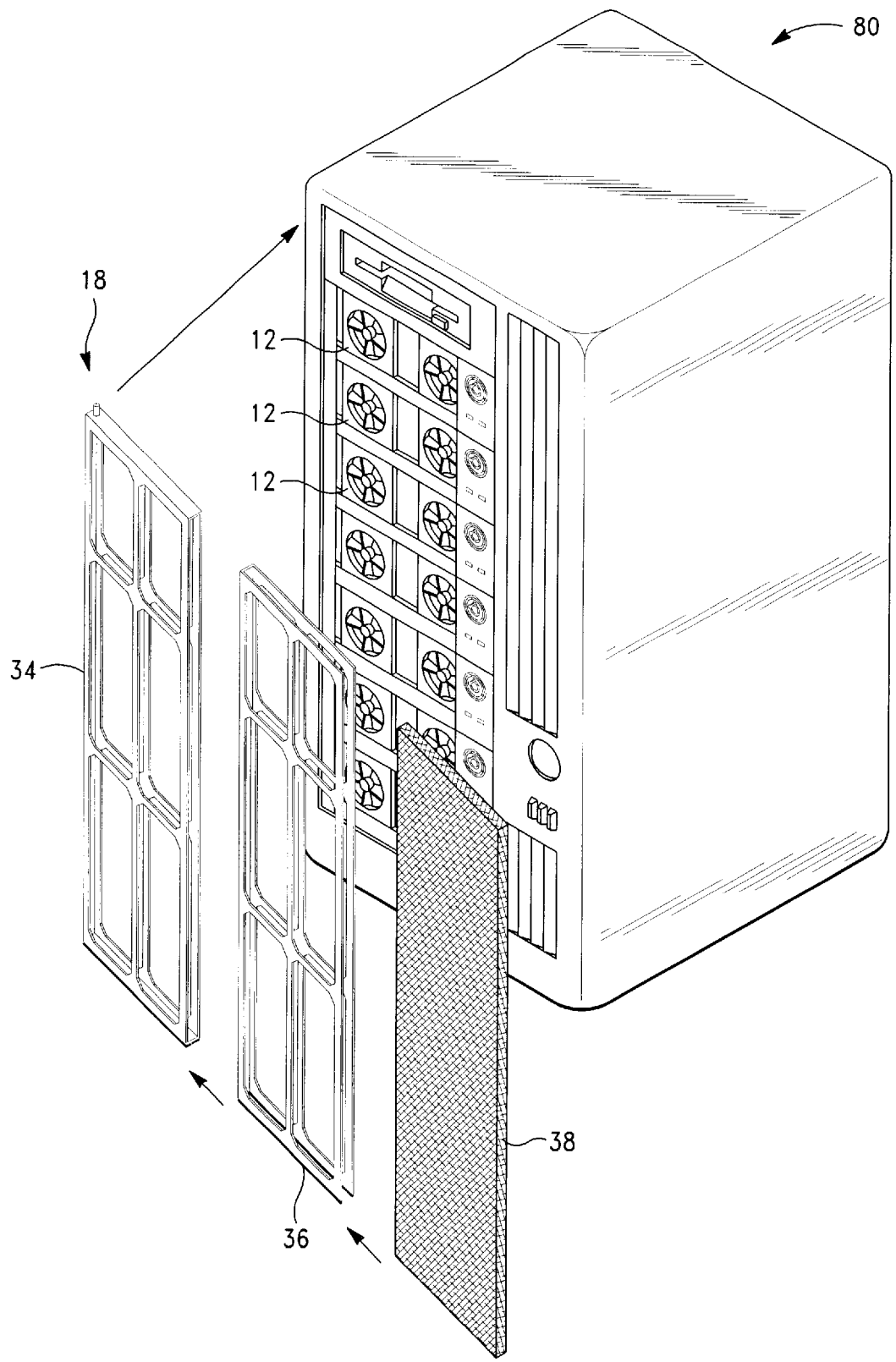
FIG. 5 shows an exploded view of the invention in accordance with FIG. 4.

FIG. 5 shows the memory storage device housing 80 and the air filter assembly 18. The frame 34, the air filter 38 and the retainer 36 are sized large enough to cover multiple memory storage device bays 12.

What is claimed is:

1. An air filter assembly for a memory storage device bay, comprising:

a frame having a first lateral side with a hinge connectable with the memory storage device bay having an inner periphery with grooves, and having a second lateral side with an opening;

an air filter; and a retainer for sliding the air filter into the opening of the frame, the retainer having two sides and a flexible joint to move the sides between an open configuration to a closed configuration, in the closed configuration, the sides of the retainer sandwich the air filter to hold the air filter, each side has edges that slide in the grooves of the frame to insert the retainer in the frame when the retainer is in the closed configuration.

2. An air filter assembly as set forth in claim 1, wherein the flexible joint spring biases the retainer in the open configuration to press the edges against the grooves of the frame when the retainer inserts into the frame.

3. An air filter assembly as set forth in claim 1, wherein the air filter has an inner face and an outer face, the sides of the retainer surround the inner face and the outer face, respectively.

4. An air filter assembly as set forth in claim 3, wherein the sides of the retainer form a grate.

5. An air filter assembly as set forth in claim 1, wherein the frame has an inlet, an outlet and two lateral sides, one side defines an opening that aligns with the grooves of the frame for receiving the retainer and the air filter.

6. An air filter assembly for a memory storage device bay, comprising:
   a frame connectable with the memory storage device bay and having an inner periphery with grooves;
   an air filter;
   a retainer for sliding the air filter into the frame, the retainer having two sidles and a flexible joint to move the sides between an open configuration to a closed configuration, in the closed configuration, the sides of the retainer sandwich the air filter to hold the air filter, each side has edges that slide in the grooves of the frame to insert the retainer in the frame when the retainer is in the closed configuration; and
   wherein the frame has two lateral sides, one lateral side defines an opening for receiving the retainer and the air filter, and the other lateral side includes a hinge to attach the frame to the memory storage device bay, the hinge enables the frame to swing about attach hinge between an open position and a closed position, the open position exposes the opening to enable air filter removal and replacement.

7. An air filter assembly as set forth in claim 1, wherein the air filter has a rectangular shape to fully cover a memory storage device bay.

8. An air filter assembly as set forth in claim 1, wherein the retainer is fabricated from metal.

9. An air filter assembly for a memory storage device bay, comprising:
   a frame having an inlet, an outlet and two lateral sides, one lateral side includes a hinge connectable with the memory storage device bay, the frame has an inner periphery with grooves;
   an air filter; and
   a retainer having two sides and a flexible joint to move the sides between an open configuration to a closed configuration, in the closed configuration, the sides of the retainer sandwich the air filter to hold the air filter, each side has edges that slide in the grooves of the frame to insert the retainer in the frame when the retainer is in the closed configuration.

10. An air filter assembly as set forth in claim 9, the other lateral side of the frame defines an opening that aligns with the grooves of the frame for receiving the retainer and the air filter.

11. An air filter assembly as set forth in claim 9, wherein the flexible joint spring biases the retainer in the open configuration to press the edges against the grooves of the frame when the retainer inserts into the frame.

12. An air filter assembly as set forth in claim 9, wherein the sides air filter has an inner face and an outer face, the sides of the retainer surround the inner face and the outer face.

13. An air filter assembly as set forth in claim 12, wherein the sides of the retainer form a grate.

14. An air filter assembly as set forth in claim 12, wherein the air filter has a rectangular shape to fully cover a memory storage device bay.

15. An air filter assembly as set forth in claim 12, wherein the retainer is fabricated from metal.

16. A memory storage device housing having at least one memory storage device bay and a cooler assembly for cooling the memory storage device bay, comprising:
   a hard drive cooler assembly having a fan mounted in at least one memory storage device bay for convectively cooling the memory storage device bay;
   a frame for covering the fan, the frame being connectable with the memory storage device bay, the frame has an inner periphery with grooves;
   an air filter; and
   a retainer having two sides and a flexible joint to move the sides between an open configuration to a closed configuration, in the closed configuration, the sides of the retainer sandwich the air filter to hold the air filter, each side has edges that slide in the grooves of the frame to insert the retainer in the frame when the retainer is in the closed configuration.

17. A memory storage device housing as set forth in claim 16, wherein the flexible joint spring biases the retainer in the open configuration to press the edges against the grooves of the frame when the retainer inserts into the frame.

18. A memory storage device housing as set forth in claim 16, wherein the air filter has an inner face and an outer face, the sides of the retainer surround the inner face and the outer face, respectively.

19. A memory storage device housing as set forth in claim 18, wherein the sides of the retainer form a grate.

20. A memory storage device housing as set forth in claim 18, wherein housing includes multiple memory storage device bays, the frame, air filter and retainer cover the multiple bays.

21. A memory storage device housing having at least one memory storage device bay and a cooler assembly for cooling the memory storage device bay, comprising:
   a hard drive cooler assembly having a fan mounted in at least one memory storage device bay for convectively cooling the memory storage device bay;
   a frame for covering the fan, the frame being connectable with their memory storage device bay, the frame has an inner periphery with grooves;
   an air filter;
   a retainer having two sides and a flexible joint to move the sides between an open configuration to a closed configuration, in the closed configuration, the sides of the retainer sandwich the air filter to hold the air filter, each side has edges that slide in the grooves of the frame to insert the retainer in the frame when the retainer is in the closed configuration; and
   wherein the frame has two lateral sides, one lateral side defines an opening for receiving the retainer and the air filter, and the other lateral side includes a hinge to attach the frame to the memory storage device bay, the hinge enables the frame to swing about the hinge between an open position and a closed position, the open position exposes the opening to enable air filter removal and replacement.

* * * * *